(12) United States Patent
Sakai et al.

(10) Patent No.: US 10,481,388 B1
(45) Date of Patent: Nov. 19, 2019

(54) ELECTROWETTING DISPLAY DEVICE WITH REFLECTIVE PIXEL SPACER

(71) Applicant: Amazon Technologies, Inc., Seattle, WA (US)

(72) Inventors: Toru Sakai, Waalre (NL); Sridhar Guntaka, Eindhoven (NL); Karel Johannes Gerhardus Hinnen, Eindhoven (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 136 days.

(21) Appl. No.: 15/633,625

(22) Filed: Jun. 26, 2017

(51) Int. Cl.
*G02B 26/00* (2006.01)
*G03F 7/00* (2006.01)
*G02B 1/12* (2006.01)
*G02B 1/06* (2006.01)
*G09G 3/34* (2006.01)

(52) U.S. Cl.
CPC ............ *G02B 26/005* (2013.01); *G02B 1/06* (2013.01); *G02B 1/12* (2013.01); *G03F 7/0007* (2013.01); *G09G 3/34* (2013.01)

(58) Field of Classification Search
CPC .. G02B 26/02; G02B 26/023; G02B 26/0833; G02B 26/0841; G02B 26/00; G02B 26/001; G02B 26/005; G02B 2027/0105; G02B 2027/0118; G02B 2027/0174; G02B 2027/0178; G02B 26/007; G02B 26/04; G02B 26/101; G02B 27/017; G02B 27/0172; G02B 27/283; G02B 5/005; G02B 6/0031; G02B 6/0038
USPC ........ 359/237, 242, 265–267, 290–292, 295, 359/298
See application file for complete search history.

(56) References Cited

U.S. PATENT DOCUMENTS 9,684,161 B1 * 6/2017 Langendijk .......... G02B 26/005
2014/0183342 A1 * 7/2014 Shedletsky .......... G06F 1/1637
250/215

* cited by examiner

*Primary Examiner* — Brandi N Thomas
(74) *Attorney, Agent, or Firm* — Quarles and Brady LLP

(57) ABSTRACT

An electrowetting display device includes a first support plate and a second support plate opposite the first support plate, and a plurality of pixel walls over the first support plate. The plurality of pixel walls are associated with an electrowetting pixel and define a volume containing at least a portion of an oil and an electrolyte fluid. The electrolyte fluid has a first refractive index. The electrowetting display device includes a pixel spacer between a first pixel wall in the plurality of pixel walls and the second support plate. A second refractive index of the pixel spacer is less than the first refractive index. The electrowetting display device includes a pixel electrode over the first support plate for applying a voltage within the electrowetting pixel to cause relative displacement of the oil and the electrolyte fluid.

20 Claims, 9 Drawing Sheets

ELECTROWETTING DISPLAY DEVICE WITH REFLECTIVE PIXEL SPACER

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1A:
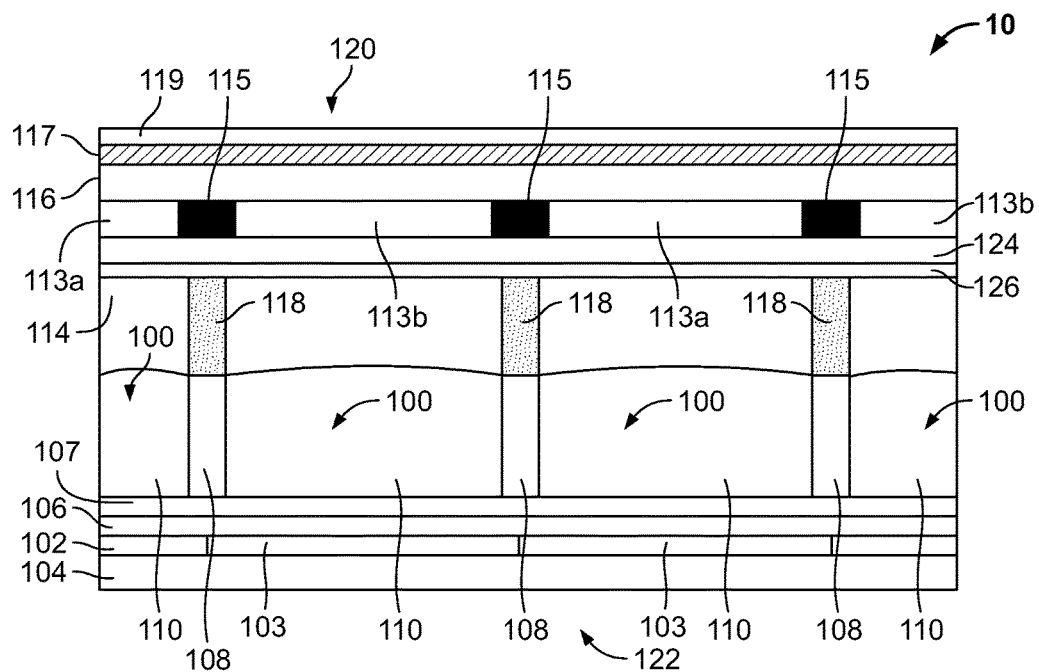
FIGS. 1A and 1B illustrate cross-sectional views of a portion of an electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and a cover layer component, which may include antiglare properties, antireflective properties, anti-fingerprint properties, anti-cracking properties, and the like.

An electrowetting display includes a number of electrowetting pixels. Within the display, each electrowetting pixel is associated with a number of pixel walls. The pixel walls form a structure that is configured to contain at least a portion of a first fluid, such as a black opaque oil. Light transmission through the electrowetting pixels can be controlled by an application of an electric potential or driving voltage to the electrowetting pixels, which results in a movement of a second fluid, such as an electrolyte solution, into or within the electrowetting pixels, thereby displacing the oil.

When an electrowetting pixel is in a rest state (i.e., with no driving voltage applied or at a driving voltage that falls below a threshold value causing the electrowetting pixel to be inactive), the oil is distributed throughout the pixel. The oil absorbs light and the pixel in this condition appears black. But when the driving voltage is applied, the oil is displaced to one or more sides of the pixel. Light can then enter the electrowetting pixel striking a reflective surface at the bottom of the pixel. The light then reflects out of the pixel, causing the pixel to appear less dark (e.g., white) to an observer. If the reflective surface only reflects a portion of the spectrum of visible light or if color filters are incorporated over the pixel, the pixel may appear to have color. The degree to which the oil is displaced from the oil's resting position affects the overall reflectance of the pixel—the pixel's capability to reflect or transmit light—and, thereby, the pixel's appearance or brightness. By manipulating the driving voltage applied to the electronic device's electrowetting pixels, different images can be depicted on a display surface of the electronic device.

Electrowetting displays include an array of electrowetting pixels sandwiched between two support plates, such as a bottom support plate and a top support plate. The electrowetting pixels include various layers of materials built upon the bottom support plate, including a fluoropolymer layer, around portions of which the pixel walls are constructed. The top support plate is then mounted over the bottom support plate to enclose a volume containing the oil. The top support plate and the bottom support each include electrode layers that operate in combination to subject the electrowetting pixels to various driving voltages, resulting in oil displacement.

To provide for accurate positioning of the top support plate with respect to the bottom support plate and for physical support of the top support plate, a number of pixel spacers may be attached to the top support plate. With the top support plate mounted over the bottom support plate, the pixel spacers rest between the pixel walls that are formed on the bottom support plate and the top support plate. The pixel spacers can then provide physical support to the top support plate and also can provide that the top support plate is held a minimum distance away from the bottom support plate.

In conventional display devices, the pixel spacers are fabricated from a material having the same or very similar refractive index to that of the electrolyte fluid of the electrowetting pixels. As such, the pixel spacers appear transparent. As a result, light entering one pixel within the display device can sometimes propagate through the pixel spacers into other pixels. This phenomenon, referred to herein as cross-talk, can cause visual artifacts to appear in the display device. In display devices having colored pixels, this cross-talk can result in a shift in the colors of the image being generated by the display device. Typically, cross-talk can cause color shift as pixels of one color reflect light that in fact entered differently-colored pixels of the display device.

To mitigate potential cross-talk within a display device, the present system provides an electrowetting pixel in which the pixel spacers are fabricated using material having a refractive index that is less than that of the surrounding electrolyte fluid. Given the differing refractive indices at the interface between the pixel spacers and the electrolyte fluid, light that strikes the interface at an angle greater than the interface's critical angle is reflected by the pixel spacer. As described herein, this can prevent light from passing through the pixel spacer into a neighboring electrowetting pixel, which in turn can reduce cross-talk within the device.

Some display devices may incorporate light guides arranged to direct artificial light towards the display device. Such a light guide can therefore supplement available natural and ambient light to improve the viewability of the display device's viewing surface. The light guide is a light-transmissive, internally reflective layer of material at the front or rear surface of the display device. In reflective displays the light guide may be on the "viewing side" of the reflective surface (i.e., between the reflective surface and the viewer), and in transmissive displays the light guide may be on the "back side" of the pixels (i.e., between the pixel array and the back of the device). The light guide may include internal structures that direct the incident light through the light guide and onto a desired location of the display.

In some light guides, different regions of the light guide structure may tend to predictably emit light at different angles. For example, in some light guide designs, regions of the light guide structure nearby the light guide's light source may tend to emit light that will strike nearby pixel spacers at a smaller incident angle (i.e., closer to orthogonal) than regions of the light guide further away from the light guide's light source. In other types of light guides, the angle at which light is emitted may vary differently depending upon distance from the light guide's light source at which the light is emitted. When a display device incorporates a light guide structure, therefore, pixel spacers under different regions of the light guide structure may therefore have different refractive indices based upon the angle of incoming light from the light guide structure. For example, the different refractive indices of the different pixel spacers may be selected so that the interface between each pixel spacer and the surrounding electrolyte fluid will tend to reflect incoming light from the overhead portion of the light guide.

Hereinafter, example embodiments include, but are not limited to, reflective electrowetting displays that include a clear, transparent, or semi-transparent top support plate and a bottom support plate, which need not be transparent. The clear top support plate may comprise glass or any of a number of transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display. Also, as used herein for the sake of convenience of describing example embodiments, the top support plate is that through which viewing of pixels of a (reflective) electrowetting display occurs.

A display device, such as an electrowetting display device, may be a transmissive, reflective or transflective display that generally includes an array of pixels configured to be operated by an active matrix addressing scheme. In this disclosure, a pixel may, unless otherwise specified, comprise a single sub-pixel or a pixel that includes two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel may be a red sub-pixel, a green sub-pixel, a blue sub-pixel or a white sub-pixel of a larger pixel or may, in some cases, include a number of sub-pixels. As such, a pixel may be a pixel that is a smallest component, e.g., the pixel does not include any sub-pixels.

Rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) associated with each pixel. The transistors take up a relatively small fraction of the area of each pixel to allow light to efficiently pass through (or reflect from) the display pixel.

In some embodiments, a reflective electrowetting display comprises an array of pixels sandwiched between a bottom support plate and a top support plate. The bottom support plate may be opaque while the top support plate is transparent. Herein, describing a pixel or material as being transparent generally means that the pixel or material may transmit or enable the propagation of a relatively large fraction of the light incident upon it. For example, a transparent material or layer may transmit or propagate more than 70% or 80% of the light impinging on its surface, though claimed subject matter is not limited in this respect. In contrast, opaque generally means that the pixel or material may block or inhibit the transmission or propagation of at least a portion of the visible light spectrum incident upon it. For example, a black opaque material or layer may block, absorb, or otherwise prevent the propagation of more than 70% or 80% of the light impinging on its surface, though claimed subject matter is not limited in this respect. In the present disclosure, materials that are described as preventing the propagation of light shall be understood to prevent propagation of at least 70% of the light striking the material. Alternatively, opaque material may be transmissive for a portion of the visible light spectrum and blocking other portions, forming a color filter. Similarly, materials that are described as being transparent or allowing propagation of light shall be understood to transmit or propagate at least 70% of the light striking the material. In this description, the visible light spectrum may include light having a wavelength between 390 nanometers (nm) and 700 nm.

Pixel walls retain at least a first fluid that is electrically non-conductive in the individual pixels. For example, the first fluid may include an opaque or colored oil. References in the present disclosure to an oil shall be understood to refer to any fluid that is electrically non-conductive. Each pixel includes a cavity formed between the support plates that is at least partially filled with the oil (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing in some embodiments. The second fluid is immiscible with the first fluid. Herein, substances are immiscible with one another if the substances do not substantially form a solution.

Individual reflective electrowetting pixels may include a reflective layer on the bottom support plate of the electrowetting pixel, a transparent electrode layer adjacent to the reflective layer, and a hydrophobic layer on the electrode layer. Alternatively, the reflective layer may act as the pixel electrode. Pixel walls, associated with and formed around each pixel, the hydrophobic layer, and the transparent top support plate at least partially enclose a fluid region that includes an electrolyte solution and the oil, which is immiscible with the electrolyte solution. An "opaque" fluid, as described herein, is used to describe a fluid that appears black or to have color to an observer. For example, an opaque fluid appears black to an observer when it strongly absorbs a broad spectrum of wavelengths (e.g., including those of red, green and blue light) in the visible region of light or electromagnetic radiation. In some embodiments, the opaque fluid is a non-polar electrowetting oil.

The opaque fluid is disposed in the fluid region. A coverage area of the opaque fluid on the bottom hydrophobic layer is electrically adjustable to affect the amount of light incident on the reflective electrowetting display that reaches the reflective material at the bottom of each pixel.

In addition to pixels, pixel spacers and edge seals may also be located between the two support plates. Pixel spacers and edge seals that mechanically connect the first support plate with and opposite to the second overlying support plate, or which form a separation between the first support plate and the second support plate, can contribute to the mechanical integrity of the electrowetting display. Edge seals, for example, being disposed along a periphery of an array of electrowetting pixels, may contribute to retaining fluids (e.g., the first and second fluids) between the first support plate and the second overlying support plate. Pixel spacers can be at least partially transparent so as to not hinder throughput of light in the electrowetting display. The transparency of pixel spacers may at least partially depend on the refractive index of the pixel spacer material, which can be similar to or the same as the refractive indices of surrounding media. Pixel spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
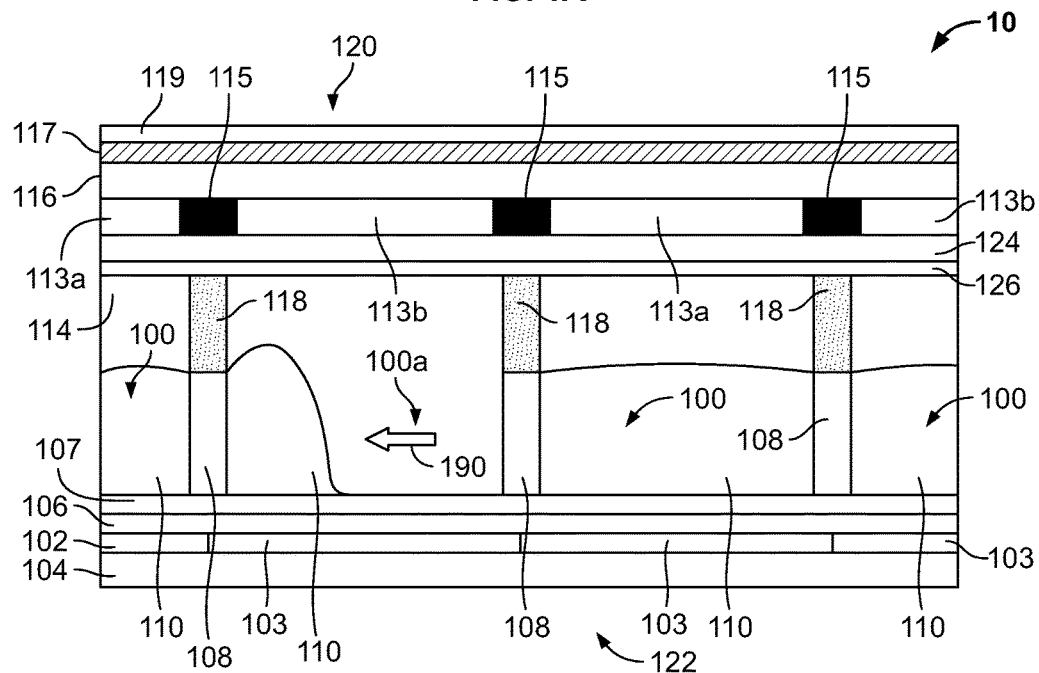
Figure 2A:
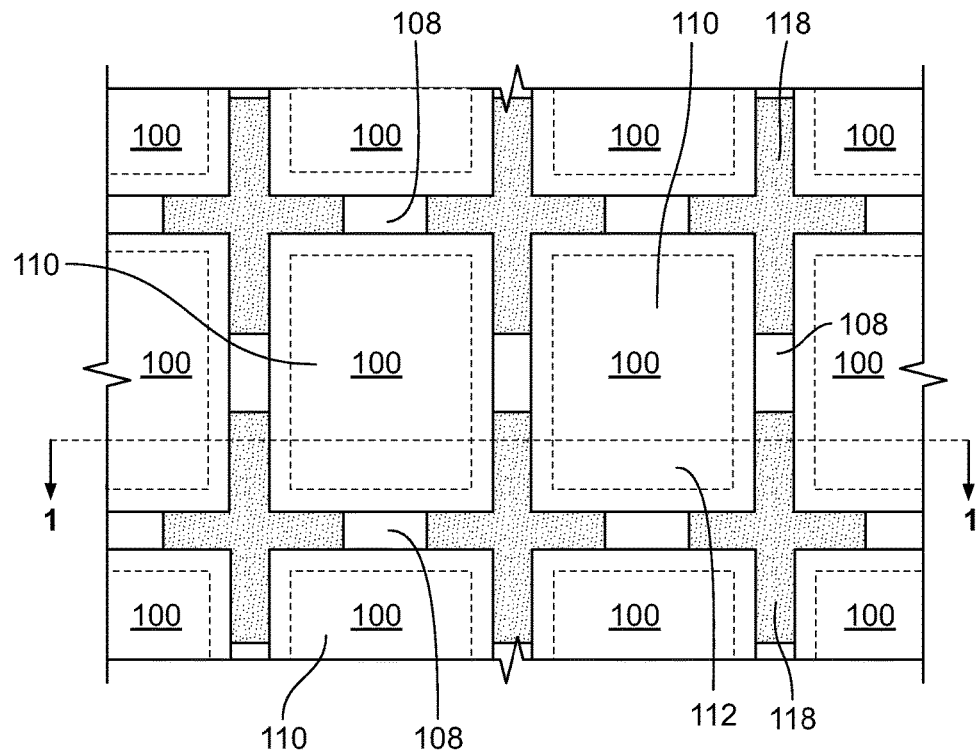
FIG. 2A illustrates a top view of the electrowetting pixels of FIG. 1A, according to various embodiments.

FIG. 1A is a cross-section of a portion of an example conventional reflective electrowetting display device 10 illustrating several electrowetting pixels 100 taken along sectional line 1-1 of FIG. 2A. FIG. 1B shows the same cross-sectional view as FIG. 1A in which an electric potential has been applied to one of the electrowetting pixels 100 causing displacement of an oil disposed therein, as described below. FIG. 2A shows a top view of electrowetting pixels 100 formed over a bottom support plate 104 as well as pixel spacers 118. The view shown in FIG. 2A is simplified and does not depict each component illustrated in FIGS. 1A and 1B and primarily illustrates the row and column layout of pixels 100 with pixel spacers 118.

In FIGS. 1A and 1B, two complete electrowetting pixels 100 and two partial electrowetting pixels 100 are illustrated. Electrowetting display device 10 may include any number (usually a very large number, such as thousands or millions) of electrowetting pixels 100.

An electrode layer 102 is formed on a bottom support plate 104. In various embodiments, electrode layer 102 consists of individual pixel electrodes 103, each addressing an individual pixel 100. The individual pixel electrodes 103 may be connected to a transistor, such as a thin film transistor (TFT) (not shown), that is switched or otherwise controlled to either select or deselect an electrowetting pixel 100 using an active matrix addressing scheme, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example. The TFTs and corresponding data lines may be formed within electrode layer 102 or within other layers over or within support plate 104.

In some embodiments, a dielectric barrier layer 106 may at least partially separate electrode layer 102 from a hydrophobic layer 107, also formed on bottom support plate 104. Barrier layer 106 may be formed from various materials including organic/inorganic multilayer stacks or layers. In some embodiments, hydrophobic layer 107 is an amorphous fluoropolymer layer including any suitable fluoropolymer(s), such as AF1600®, produced by DuPont, based in Wilmington, Del. Hydrophobic layer 107 may also include suitable materials that affect wettability of an adjacent material, for example.

Pixel walls 108 form a patterned electrowetting pixel grid on hydrophobic layer 107. Pixel walls 108 may comprise a photoresist material such as, for example, epoxy-based negative photoresist SU-8. The patterned electrowetting pixel grid comprises rows and columns that form an array of electrowetting pixels. For example, an electrowetting pixel may have a width and a length in a range of about 50 to 500 micrometers.

Oil 110 (or another opaque fluid), which may have a thickness (e.g., a height) in a range of about 1 to 10 micrometers, for example, overlays hydrophobic layer 107. Oil 110 is partitioned by pixel walls 108 of the patterned electrowetting pixel grid. A second fluid 114, such as an electrolyte solution, overlays oil 110 and pixel walls 108 of the patterned electrowetting pixel grid. Oil 110 is immiscible with second fluid 114.

Top support plate 116 is mounted over bottom support plate 104 to enclose a volume containing oil 110 and second fluid 114. Support plate 116 is generally transparent and may include a material such as glass, transparent thermoplastic, or the like. Color filters 113 are formed over a bottom surface (as illustrated in FIGS. 1A and 1B) of support plate 116.

Color filters 113a, 113b (collectively, 113) may be positioned over each of pixels 100. Each color filter 113 may be configured to be substantially transparent to particular ranges of wavelengths of light, while absorbing others. For example, color filter 113a may be transparent to red light having wavelengths ranging from 620 nm to 750 nm, while absorbing light having other wavelengths. Conversely, color filter 113b may be transparent to green light having wavelengths ranging from 495 nm to 570 nm, while absorbing light having other wavelengths. Various pixels 100 within device 10 may be associated with color filters 113 that are transparent to all wavelengths of visible light, namely visible white light. As used herein, visible light refers to wavelengths of electromagnetic radiation visible to the human eye. Generally, this includes electromagnetic radiation having wavelengths between about 400 nm to about 700 nm.

Figure 2B:
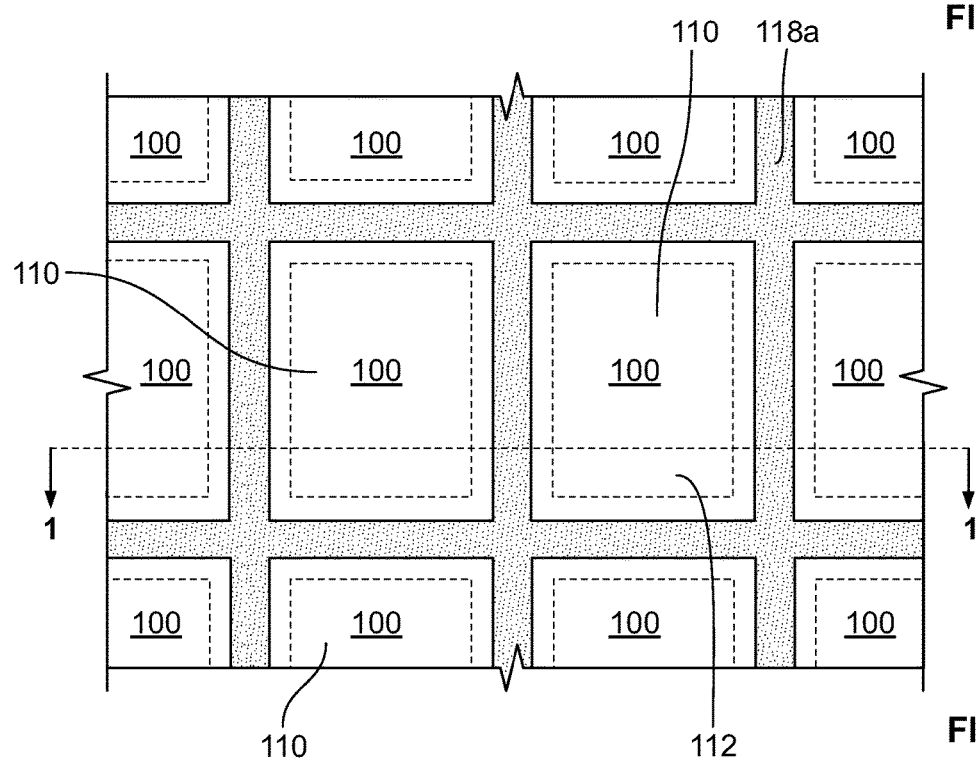
FIG. 2B illustrates a top view of the electrowetting pixels of FIG. 1A, incorporating a single pixel spacer structure over multiple electrowetting pixels.

Color filters 113, therefore, may be utilized to assign each pixel 100 a color, so that when a particular pixel 100 is in an open or at least partially open state, light reflected by a viewing area 112 (see FIGS. 2A and 2B of that pixel 100 will take on the color of the color filter 113 positioned over that pixel 100. In other embodiments of device 10, color filter 113 could instead be located over a bottom surface of each pixel (e.g., upon or incorporating into hydrophobic layer 107.

A number of black matrix members 115 are also formed over a surface of top support plate 116. Black matrix members 115 are generally positioned over each pixel wall 108 in device 10 when top support plate 116 is mounted over bottom support plate 104. Black matrix members 115 are configured to block or absorb all wavelengths of visible light and therefore reduce an amount of light that may enter device 10 over one pixel 100 while exiting device 10 over a different pixel 100.

As shown in FIGS. 1A and 1B, organic layer 124 is formed over the bottom surface of top support plate 116. Specifically, organic layer 124 is formed over the color filters 113 and black matrix members 115. Organic layer 124 may include an organic material, such as an organic polymer, an organic photo-sensitive polymer material, polyimide, acrylate or epoxy-based polymer material, such as an acrylate based overcoat material.

Electrode layer 126 is formed over organic layer 124. In embodiments, electrode layer 126 includes a conductive but generally transparent material such as indium tin oxide (ITO), conductive polymer, graphene or carbon nanotubes. Electrode layer 126 operates in conjunction with the individual pixel electrodes 103 of the bottom support plate 104 to subject the individual electrowetting pixels 100 to their respective driving voltages. In the depicted embodiment, electrode layer 126 forms a common continuous electrode positioned over all, or at least a majority, of electrowetting pixels 100 of electronic device 10. With electrode layer 126 set to a common voltage, the voltages of the individual pixel electrodes 103 can be separately adjusted to subject electrowetting pixels 100 to various driving voltages.

When top support plate 116 is mounted over bottom support plate 104, pixel spacers 118 rest upon a top surface of one or more pixel walls 108, as depicted in FIGS. 1A and 1B. Multiple pixel spacers 118 may be interspersed throughout the array of pixels 100. The dimensions and shape of pixel spacers 118 are not generally constrained—alternative shapes include crosses, lines of pixel spacers, or full grid pixel spacer structures. As shown in FIGS. 1A and 1B, pixel spacers 118 are generally located over pixel walls 108. FIG. 2A shows a cross sectional view of electrowetting pixels 100 including pixel walls 108 and the pixel spacers 118 resting upon the pixel walls 108. As illustrated, pixel spacers 118 are shaped so that they are located over only pixels walls 108 and no portion (or at least a limited portion) of pixel spacers 118 occupies of is otherwise located over pixels 100. This shape of pixel spacers 118 reduces the likelihood that pixel spacers 118 will interfere with or potentially block light entering or being reflected out of pixels 100. In FIG. 2A, pixel spacers 118 are generally located over the intersections of pixel walls 108 and each pixel spacer 118 includes extensions that extend over a portion of each pixel wall 108 making up the intersection. Accordingly, pixel spacers 118 in this configuration have a '+' shape. In other embodiments, however, pixel spacers 118 may have any suitable shape for being positioned over or attaching to one or more pixel wall 108.

In some other embodiments, pixel spacers 118 may be configured to completely enclose each electrowetting pixel 100. In that case, pixels spacers 118 with display device 10 may all be interconnected forming a single continuous pixel spacer 118 structure. For example, FIG. 2B depicts a cross-section of device 10 incorporating such a pixel spacer structure. As illustrated, rather than incorporate multiple pixel spacer 118 structures, a single pixel spacer structure 118a is provide. As depicted in FIG. 2B, pixel spacer structure 118a is formed as a grid structure that, at least to some degree, mimics the grid structure set out by pixel walls 108. As such, pixel spacer structure 118a may rest upon and make contact with pixel walls 108 and only overlays pixel walls 108 without project further into or over a portion of pixels 100.

Returning to FIGS. 1A and 1B, in some embodiments of device 10, a front light component may be positioned over an edge of viewing side 120 of device 10. In these embodiments, a light guide 117 may be positioned over device 10 to guide light generated by the front light component over viewing side 120 of device 10. A layer 119, e.g. glass or other material, incorporating various touch-sensitive structures may also be positioned over device 10. A diffuser film (not shown) may be formed over or, in some cases, integrated into, a portion of, top support plate 116 to diffuse light striking a surface of top support plate 116 and passing there through.

Display device 10 has viewing side 120 on which an image formed by electrowetting display device 10 may be viewed, and an opposing rear side 122. Support plate 116 faces viewing side 120 and bottom support plate 104 faces rear side 122. Reflective electrowetting display device 10 may be a segmented display type in which the image is built of segments. The segments may be switched simultaneously or separately. Each segment includes one electrowetting pixel 100 or a number of electrowetting pixels 100 that may be adjacent or distant from one another. Electrowetting pixels 100 included in one segment are switched simultaneously, for example. Electrowetting display device 10 may also be an active matrix driven display type or a passive matrix driven display, for example.

As mentioned above, second fluid 114 is immiscible with oil 110. Second fluid 114 is electrically conductive and/or polar, and may be water or a salt solution such as a solution of potassium chloride in water, for example. In certain embodiments, second fluid 114 is transparent, but may be colored or light-absorbing. Oil 110 is electrically non-conductive and may for instance be an alkane like hexadecane or (silicone) oil.

Hydrophobic layer 107 is arranged on bottom support plate 104 to create an electrowetting surface area. The hydrophobic character of hydrophobic layer 107 causes oil 110 to adhere preferentially to hydrophobic layer 107 because oil 110 has a higher wettability with respect to the surface of hydrophobic layer 107 than second fluid 114 in the absence of a driving voltage. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

In some embodiments, oil 110 absorbs light within at least a portion of the optical spectrum and so may form a color filter. The fluid may be colored by addition of pigment particles or dye, for example. Alternatively, oil 110 may be black (e.g., absorbing substantially all light within the optical spectrum) or reflecting. Hydrophobic layer 107 may be transparent or reflective. A reflective layer may reflect light within the entire visible spectrum, making the layer appear bright, or reflect a portion of light within the visible spectrum, making the layer have a color.

If a driving voltage is applied across an electrowetting pixel 100, electrowetting pixel 100 will enter into an active or at least partially open state. Electrostatic forces will move second fluid 114 toward electrode layer 102 within the active pixel, thereby displacing oil 110 from that area of hydrophobic layer 107 to pixel walls 108 surrounding the area of hydrophobic layer 107, to a droplet-like form. Such displacing action at least partly uncovers oil 110 from the surface of hydrophobic layer 107 of electrowetting pixel 100. Due to the configuration of electrode layer 102, when the voltage is applied across the electrowetting pixel 100, oil 110 generally always move in the same direction within the pixel 100 so as to form into a droplet against the same pixel wall 108 of the pixel 100.

FIG. 1B shows one of electrowetting pixels 100 in an active state (see pixel 100*a*). With a driving voltage applied to a pixel electrode in electrode layer 102 underneath the activated electrowetting pixel 100*a*, second fluid 114 is attracted towards pixel electrode in electrode layer 102 displacing oil 110 within the activated electrowetting pixel 100.

As second fluid 114 moves towards hydrophobic layer 107 of the activated electrowetting pixel 100, oil 110 is displaced in a predictable direction within pixel 100*a* towards one of pixel walls 108 (e.g., in the direction of arrow 190), referred to herein as the oil displacement direction, and moves towards a pixel wall 108 of the activated pixel 100 or is otherwise displaced. The predictable direction 190 of oil 110 movement may result from the floor of pixel 100*a* (e.g., the top surface of hydrophobic layer 107 being at least partially raised at the far right of pixel 100*a* (as viewed in 1B, but not shown)).

In the example of FIG. 1B, pixel 100*a* is fully open at a maximum driving voltage and oil 110 of pixel 100*a* has formed a droplet over an oil accumulation area of pixel 100*a* as a result of the driving voltage being applied to pixel 100*a*. After activation of pixel 100*a*, when the voltage across electrowetting pixel 100*a* is returned to an inactive signal level of zero or a value near to zero, electrowetting pixel 100*a* will return to an inactive or closed state, where oil 110 flows back to cover hydrophobic layer 107. In this way, oil 110 forms an electrically controllable optical switch in each electrowetting pixel 100.

With oil 110 of pixel 100*a* displaced following the application of a driving voltage to pixel 100*a*, light can enter pixel 100*a* through color filter 113*b*, strike the exposed portion of the reflective surface at the bottom of pixel 100*a*, and reflect back out through color filter 113*b*.

Figure 3:
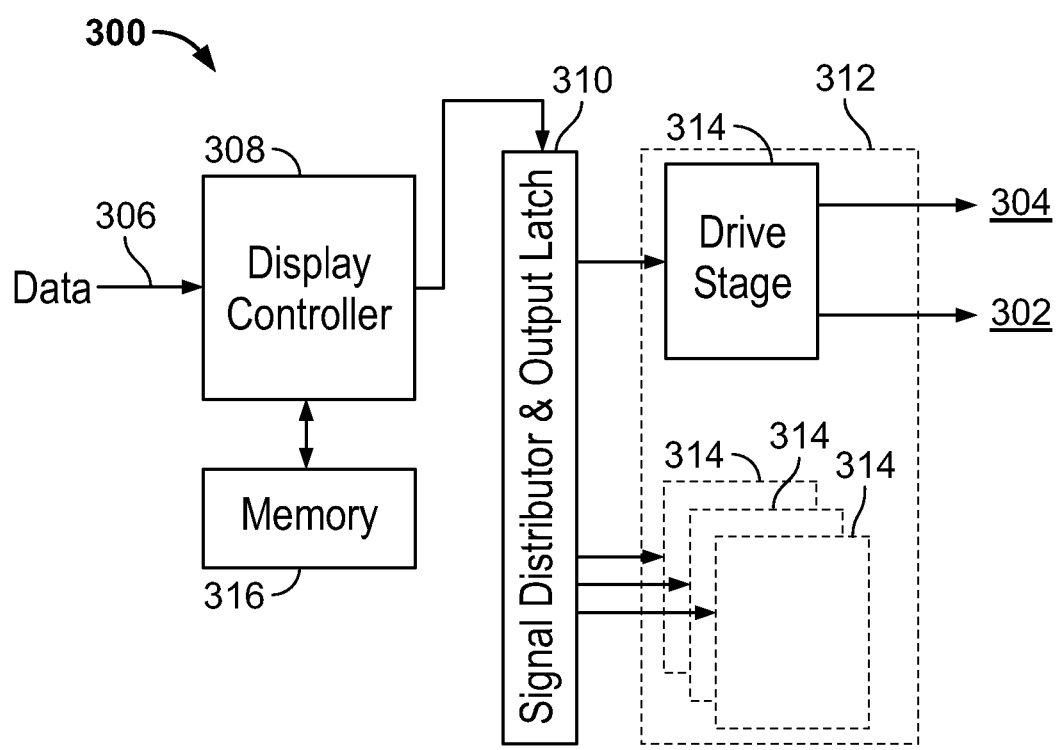
FIG. 3 is a block diagram of an example embodiment of an electrowetting display driving system, including a control system of the electrowetting display device.

FIG. 3 shows a block diagram of an example embodiment of an electrowetting display driving system 300, including a control system of the display device. Display driving system 300 can be of the so-called direct drive type and may be in the form of an integrated circuit adhered or otherwise connected to bottom support plate 104. Display driving system 300 includes control logic and switching logic, and is connected to the display by means of electrode signal lines 302 and a common signal line 304. Each electrode signal line 302 connects an output from display driving system 300 to a different electrode within each pixel 100, respectively. Common signal line 304 is connected to second fluid 114 through a common electrode. Also included are one or more input data lines 306, whereby display driving system 300 can be instructed with data so as to determine which pixels 100 should be in an active or open state and which pixels 100 should be in an inactive or closed state at any moment of time. In this manner, display driving system 300 can determine a target reflectance value for each pixel 100 within the display.

Electrowetting display driving system 300 as shown in FIG. 3 includes a display controller 308, e.g., a microcontroller, receiving input data from input data lines 306 relating to the image to be displayed. Display controller 308, being in this embodiment the control system, is configured to apply a voltage to the first electrode to establish a particular display state (i.e., reflectance value) for a pixel 100. The microcontroller controls a timing and/or a signal level of at least one pixel 100.

The output of display controller 308 is connected to the data input of a signal distributor and data output latch 310. Signal distributor and data output latch 310 distributes incoming data over a plurality of outputs connected to the display device, via drivers in certain embodiments. Signal distributor and data output latch 310 cause data input indicating that a certain pixel 100 is to be set in a specific display state to be sent to the output connected to pixel 100. Signal distributor and data output latch 310 may be a shift register. The input data is clocked into the shift register and at receipt of a latch pulse the content of the shift register is copied to signal distributor and data output latch 310. Signal distributor and data output latch 310 has one or more outputs, connected to a driver assembly 312. The outputs of signal distributor and data output latch 310 are connected to the inputs of one or more driver stages 314 within electrowetting display driving system 300. The outputs of each driver stage 314 are connected through electrode signal lines 302 and common signal line 304 to a corresponding pixel 100. In response to the input data, a driver stage 314 will output a voltage of the signal level set by display controller 308 to set one of pixels 100 to a corresponding display state having a target reflectance level.

To assist in setting a particular pixel to a target reflectance level, memory 316 may also store data that maps a particular driving voltage for a pixel to a corresponding reflectance value and vice versa. The data may be stored as one or more curves depicting the relationship between driving voltage and reflectance value, or a number of discrete data points that map a driving voltage to a reflectance value and vice versa. As such, when display controller 308 identifies a target reflectance value for a particular pixel, display controller 308 can use the data mapping driving voltage to reflectance value to identify a corresponding driving voltage. The pixel can then be driven with that driving voltage.

In some circumstances, light entering an electrowetting pixel 100 can sometimes propagate through pixel spacers about that pixel 100 into other pixels of the display device. This cross-talk phenomenon can cause visual artifacts to appear in the display device. In display devices having colored pixels, for example, cross-talk can result in a shift in the colors of the image being generated by the display device.

Figure 4:
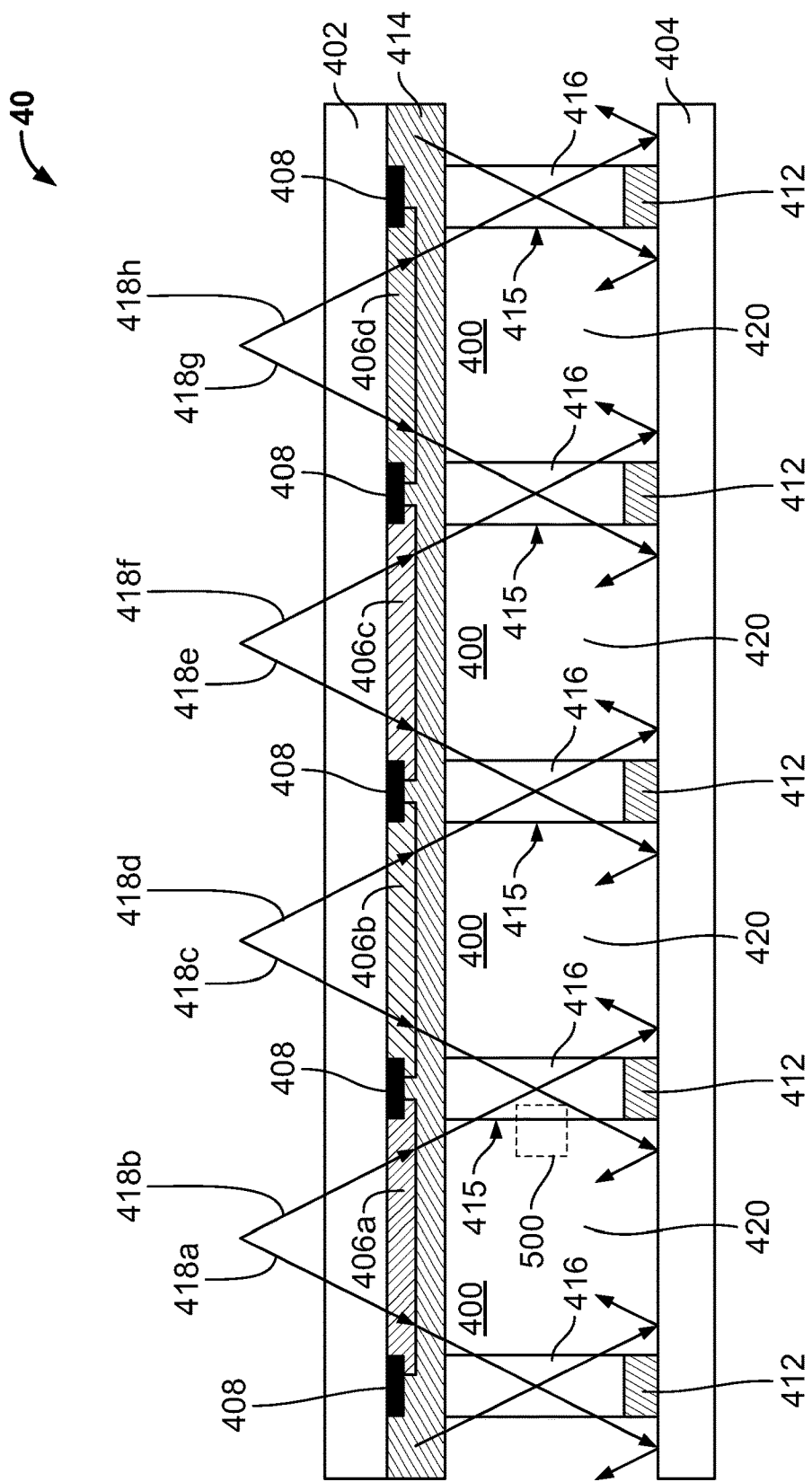
FIG. 4 is a simplified view of an electrowetting display device depicting cross-talk between different pixels in the device.

To illustrate, FIG. 4 is a simplified view of a device (e.g., device 10 of FIGS. 1A and 1B) depicting cross-talk between different pixels in the device. In FIG. 4, some of the features and details depicted in FIGS. 1A and 1B are not included so as to simplify the depiction of device 40.

Device 40 includes a number of pixels 400 between a top support plate 402 and a bottom support plate 404. Pixels 400 are at least partially defined by pixel walls 412 formed over a surface of bottom support plate 404. Fluids, such as an oil and an electrolyte fluid, may be at least partially located within the volume defined by pixel walls 412.

Top support plate 402 and bottom support plate 404 may include a number of electrical structures and circuitry (not depicted in FIG. 4) including electrodes and switches arranged to apply a desired driving voltage to pixels 400. Top support plate 402 also includes a number of color filters 406a-406d which can be used to filter the color of light passing into or being reflected out of pixels 400. Black matrix members 408 are positioned over pixel walls 412. An organic layer 414 is formed over black matrix members 408 and color filters 406a-406d.

Pixel spacers 416 are positioned between and may make contact with the top surfaces of pixel walls 412 and top support plate 402 (specifically, organic layer 414 of top support plate 402). Pixel spacers 416 may be formed of a photoresist material and are generally transparent. Specifically, the refractive index of the material making up pixel spacers 416 is the same as the refractive index of the electrolyte fluid in each pixel 400.

In FIG. 4, a number of light rays 418a-418h are depicted. As shown, light rays 418a-418h enter each a pixel 400 at a sufficient angle to strike pixel spacers 416 formed over the pixel walls 412 of each pixel 400. Because pixel spacers 416 are transparent, each of light rays 418a-418h passes through the corresponding pixel spacer 416 into the neighboring pixel 400. The light rays 418a-418h will then be reflected out of those neighboring pixels 400, out of device 40, where the light rays can be viewed by a viewer. As described above, this is referred to as cross-talk and can result in visual artifacts observable by the viewer of device 40.

Because the refractive index of pixel spacers 416 and the electrolyte fluid 420 of each pixel are the same, any light passing through electrolyte fluid 420 and striking one of pixel spacers 416 will pass through the interface between electrolyte fluid 420 and the pixel spacer 416 without being reflected or otherwise deflected, potentially entering a neighboring electrowetting pixel 400.

Within an electrowetting pixel 400, the interface between electrolyte fluid 420 and a pixel spacer 416 is associated with a critical angle. The critical angle is measured from a line orthogonal to the interface (i.e., the sidewall of pixel spacer 416). If light strikes the interface at an angle less than the critical angle, the light will pass through the interface. If, however, the light strikes the interface at an angle greater than the critical angle, the light will be reflected by the interface. The critical angle for the interface is determined by the refractive indices of the electrolyte fluid and the pixel spacer.

Figure 5:
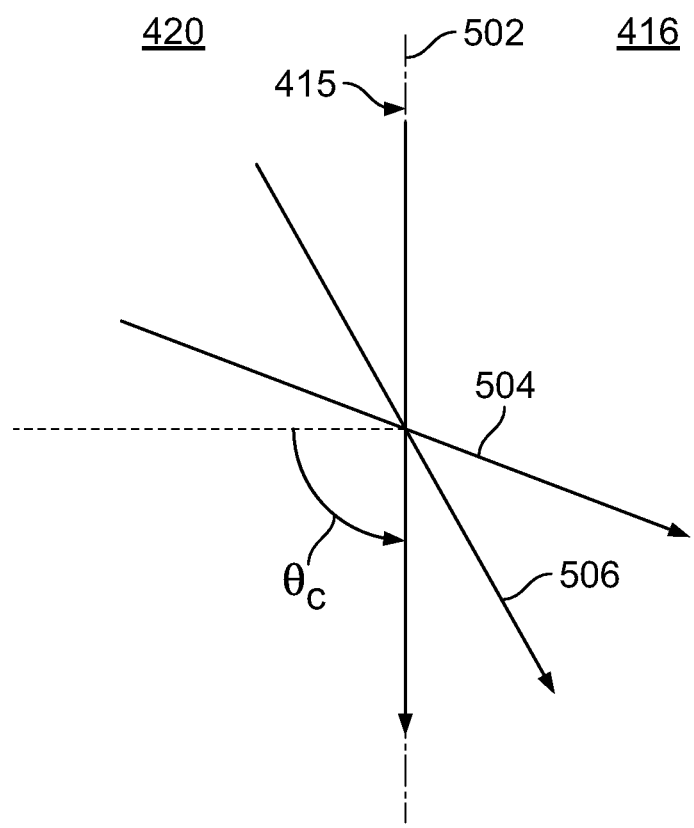
FIG. 5 depicts an enlarged view of an interface between an electrolyte fluid and a pixel spacer of the device of FIG. 4.

If electrolyte fluid 420 and the pixel spacer 416 have the same refractive index, the critical angle is equal to 90 degrees. This means that all light striking the interface will pass through the interface and will not be reflected. To illustrate, FIG. 5 depicts a zoomed-in view of the interface 502 between electrolyte 420 and a pixel spacer 416. FIG. 5 may represent, for example, an enlarged view of region 500 in FIG. 4. In this example, electrolyte 420 and pixel spacer 416 have the same refractive index. As such, the critical angle Θc is equal to 90 degrees and all light rays (including light rays 504 and 506) incident on interface 502 will pass through the interface. Here, the sidewall 415 of pixel spacer 416 may be considered to represent the interface 502 between pixel spacer 416 and electrolyte 420.

The critical angle for interface 502 of electrolyte 420 and pixel spacers 416 can be adjusted by changing the refractive index of the electrolyte and/or the pixel spacers. Specifically, the critical angle is determined by the ratio of the refractive index of the electrolyte (n1) to the refractive index of the pixel spacer (n2) according to the following equation:

$$\Theta c = \sin^{-1}(n2/n1) \qquad \text{Equation (1)}$$

Accordingly, by reducing the refractive index of pixel spacers 416, the critical angle of interface 502 between electrolyte 420 and pixel spacers 416 can be reduced meaning that more light is likely to be reflected by the interface, thereby reducing cross-talk. To illustrate, FIG. 6 depicts a device 60 in which the refractive index of the device's pixel spacers has been reduced as compared to the device's electrolyte fluid resulting in a reduction of cross-talk between pixels in the device.

Figure 6:
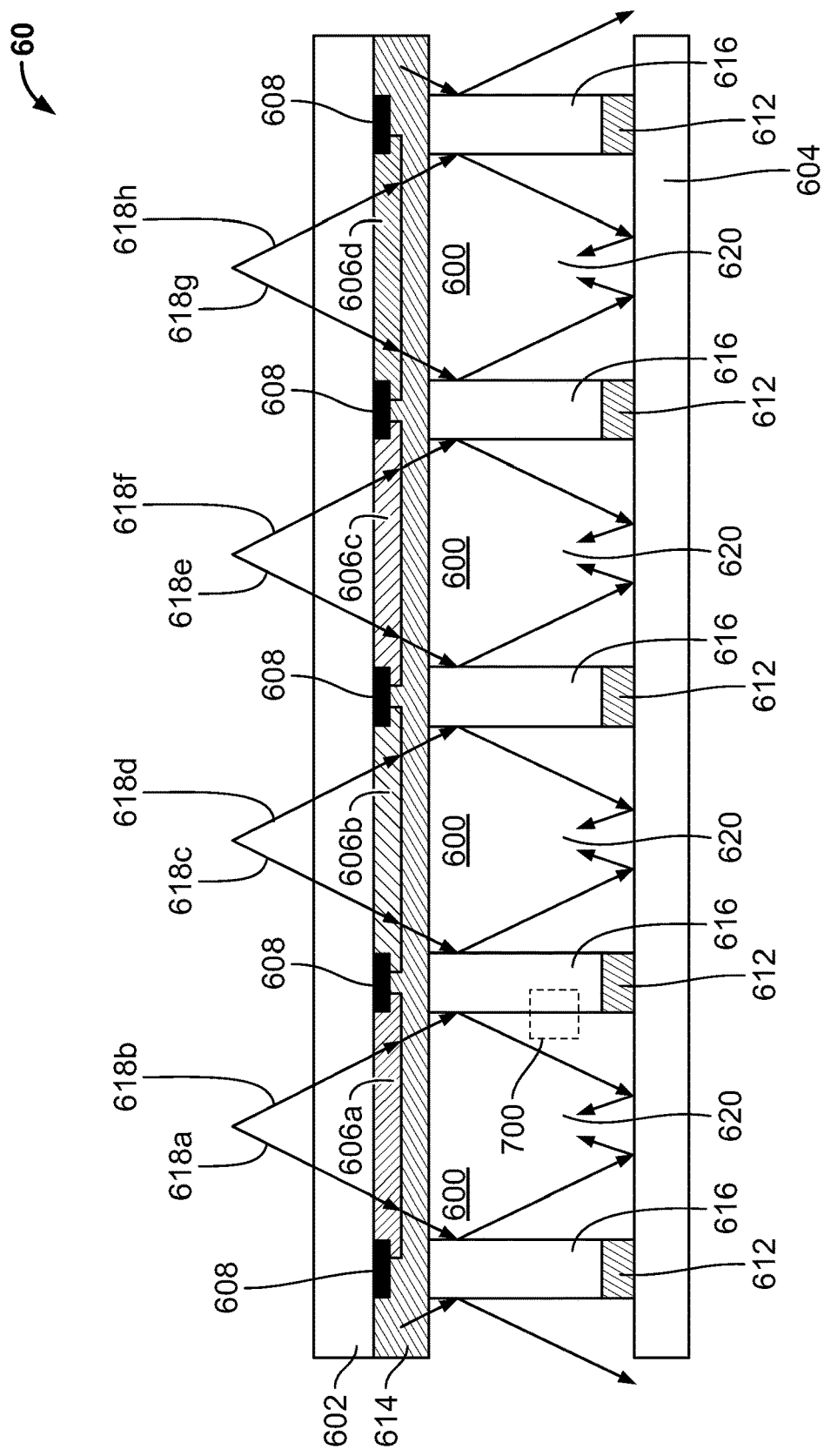
FIG. 6 is a simplified view of a device in which pixel spacers have a reduced refractive index to reduce cross-talk between pixels of the device.

FIG. 6 is a simplified view of a device in which the pixel spacers are configured to reduce cross-talk. Device 60 includes a number of pixels 600 between a top support plate 602 and a bottom support plate 604. Pixels 600 are at least partially defined by pixel walls 612 formed over a surface of bottom support plate 604. Fluids, such as an oil (not shown in FIG. 6) and an electrolyte fluid 620, may be at least partially located within the volume defined by pixel walls 612.

Top support plate 602 and bottom support plate 604 may include a number of electrical structures (not shown) including electrodes and switches arranged to apply a desired driving voltage to pixels 600. Top support plate 602 also includes a number of color filters 606a-606d. Black matrix members 608 are positioned over pixel walls 612. An organic layer 614 is formed over black matrix members 608 and color filters 606a-606d.

Pixel spacers 616 are positioned between and may be in contact with the top surfaces of pixel walls 612 and top support plate 602 (specifically, organic layer 614 of top support plate 602). In FIG. 6, each depicted pixel spacer 616 may be a separate structure disposed between top support plate 602 and bottom support plate 604. In that case, pixel spacers 616 may have a similar shape as pixel spacers 118 of FIG. 2A. In another embodiment, however, the pixel spacers 616 depicted in FIG. 6 in cross-section may each be part of a singular pixel spacer structure having a configuration similar to that of pixel spacer 118a depicted in FIG. 2B. References to pixel spacers 616 may refer to individual pixel spacers 616 structures, or pixel spacers 616 that are part of a single pixel spacer grid or structure.

Pixel spacers 616 may be formed of a photoresist material. Pixel spacers 616 are formed of a material having a refractive index that is less than the refractive index of electrolyte fluid 620. In an embodiment, for example, the refractive index of electrolyte fluid 620 may vary between 1.4 and 1.5, for example, and in embodiments may be approximately 1.5 and the refractive index of the pixel spacers 616 may be approximately 1.3 and in some cases, less than or equal to 1.35. In other embodiments, though, the electrolyte fluid 620 and pixel spacers 616 may be made of materials having other refractive indices, as described herein. For example, pixel spacers 616 may include any suitable materials having the desired refractive index. Example materials may include silicon dioxide ($SiO_2$), magnesium fluoride ($MgF_2$), calcium fluoride ($CaF_2$). In some cases pixel spacers may include fluoroacrylate polymers such as Poly(1,1,1,3,3,3-hexafluoroisopropyl acrylate) (refractive index (n)=1.375), Poly(2,2,3,3,4,4,4-heptafluorobutyl acrylate) (n=1.377), Poly(2,2,3,3,4,4,4-heptafluorobutyl methacrylate) (n=1.383), Poly(2,2,3,3,3-pentafluoropropyl acrylate) (n=1.389), Poly(1,1,1,3,3,3-hexafluoroisopropyl methacrylate) (n=1.390), Poly(2,2,3,4,4,4-hexafluorobutyl acrylate) (n=1.394), and Poly(2,2,3,3,3-pentafluoropropyl methacrylate) (n=1.395). Example refractive indices may range from 1.21 to more than 1.33, for example.

In FIG. 6, a number of light rays 618a-618h are depicted. In device 60, the interface between electrolyte 620 and pixel spacers 616 is reflective to light rays 618a-618h entering pixels 600. As such, light rays 618a-618h are reflected at the interface between electrolyte 620 and pixel spacers 616, thereby preventing light rays 618a-618h from passing through pixel spacers 616 into surrounding electrowetting pixels 600. Accordingly, cross-talk within device 60 can be mitigated.

Figure 7:
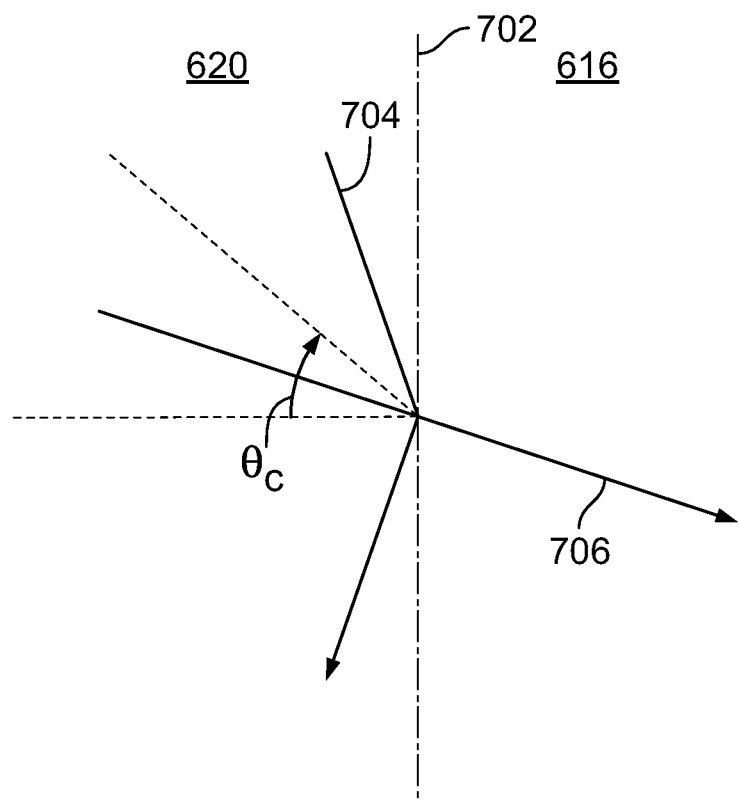
FIG. 7 depicts an enlarged view of an interface between an electrolyte fluid and a pixel spacer of the device of FIG. 6.

FIG. 7 shows a zoomed-in view of region 700 of FIG. 6 depicting interface 702 between electrolyte 620 and the sidewall of pixel spacer 616. In this example, the refractive index of electrolyte 620 is greater than the refractive index of pixel spacer 616. As such, the critical angle $\Theta c$ is less than 90 degrees. For example, if the refractive index of electrolyte fluid 620 is 1.5 and the refractive index of pixel spacer 616 is 1.3, the critical angle $\Theta c$ is equal to about 60 degrees. Light rays striking interface 702 from electrolyte fluid 620 at an angle of greater than 60 degrees (as measured from a line orthogonal to interface 702) will be reflected by interface 702. In FIG. 7, light ray 704 is an example of a light ray striking interface 702 at an angle greater than the critical angle $\Theta c$. Conversely, light rays striking interface 702 at an angle less than the critical angle $\Theta c$ will pass through interface 702. Light ray 706 is an example of a light ray striking interface 702 at an angle less than the critical angle $\Theta c$.

Returning to FIG. 6, a number of different approaches may be utilized to select appropriate indices of refraction for both the electrolyte fluid 620 and pixel spacers 616. For example, a typical device 60 may be fabricated and tested to determine the average angle at which light entering device 60 strikes the pixel spacers 616 within the device 60 being tested. For example, the device 60 may be tested in the typical types of environments (e.g., natural light environments, artificial light environments, and combinations thereof) and positions (e.g., being held by a user while standing, being held by a user while seated) that may be anticipated for routine use of device 60. In those various conditions, tests can indicate the range of angles at which light may tend to strike the pixel spacers 616 of the device 60. Based upon that information, suitable indices of refraction for the material making up electrolyte fluid 620 and pixel spacers 616 can be selected to reduce the likelihood of cross-talk occurring within device 60. For example, the indices of refraction for the material making up electrolyte fluid 620 and pixel spacers 616 may be selected so that the critical angle of the interface of electrolyte fluid 620 and pixel spacers 616 is sufficiently large to result in the reflection of all light that may strike the interface. Alternatively, the indices of refraction for the material making up electrolyte fluid 620 and pixel spacers 616 may be selected so that the critical angle of the interface of electrolyte fluid 620 and pixel spacers 616 is sufficiently large to result in the reflection of a particular percentage (e.g., 80%) of light that may typically strike the interface. For example, if light rays may strike the interface at angles up to 75 degrees, the indices of refraction may be selected so that the critical angle of the interface is 80% of that value, or 60 degrees.

In typical applications, a majority of light rays from ambient light sources may be incident upon the display at an angle nearly normal to the surface of the display. This implies that the angle of incidence of the light ray upon the surface of the spacer may tend to be above 60 degrees. In that case, if a display device is designed in such a way that the critical angle of the interface between the electrolyte fluid and the pixel spacer is 60 degrees or less, most of light rays entering the device will be reflected by that interface. The refractive index of the material making up the pixel spacers can be tuned by changing the ratio of various high refractive index additives. The selected refractive index for particular display devices may depend on the size of the display device as well as its application.

In some implementations of an electrowetting viewing device, the refractive index of the electrolyte fluid may be a value of approximately 1.5. In such a case, the critical angle of the interface between electrolyte fluid 620 and pixel spacers 616 will generally be selected by adjusting the refractive index of the material making up pixel spacers 616. If fabricated using photoresist-type materials, an example range of refractive indices for pixel spacers 616 may vary from 1.21 up to 1.34. But other materials (including other photoresist-type materials) may enable fabrication of pixel spacers 616 with other indices of refraction.

Some display devices may incorporate a light guide structure to direct light towards the viewing surface of an electrowetting display device. Generally, a light guide structure includes optical structures that direct light from a light source (e.g., an LED light source) optically coupled to the light guide onto or through a portion of the device's display. The light directed by the light guide structure may be utilized to provide a light source for the display device when no other light sources (e.g., natural or artificial) are available. In that case, the light supplied by the light guide may be the primary source of light enabling a viewer to view images displayed by the display device. In other cases, the light emitted by the light guide may be utilized to supplement other sources of light (e.g., natural or artificial) that may strike the viewing surface of or pass through the display device.

In a typical device, different regions of a display device's light guide may tend to emit light into the display device at different angles. For example, regions of the light guide far away from the light guide's light source, may emit light at an angle closer to orthogonal to the viewing surface of the display device, while regions of the light guide nearer the light guide's light source may emit light at an angle less orthogonal to the viewing surface of the display device. Other light guide may exhibit a different behavior in which regions of the light guide nearby the light guide's light source, may emit light at an angle closer to orthogonal to the viewing surface of the display device, while regions of the light guide further from the light guide's light source may emit light at an angle less orthogonal to the viewing surface of the display device, for example. In some cases, all emitted light rays along the length of the light guide may be approximately parallel to one another.

In display devices employing light guides in which different regions of the light guide tend to emit light at different angles, the indices of refraction of the pixel spacers below those different regions can be selected in accordance with the present disclosure based upon the typical angle of incoming light from the light guide.

Figure 8:
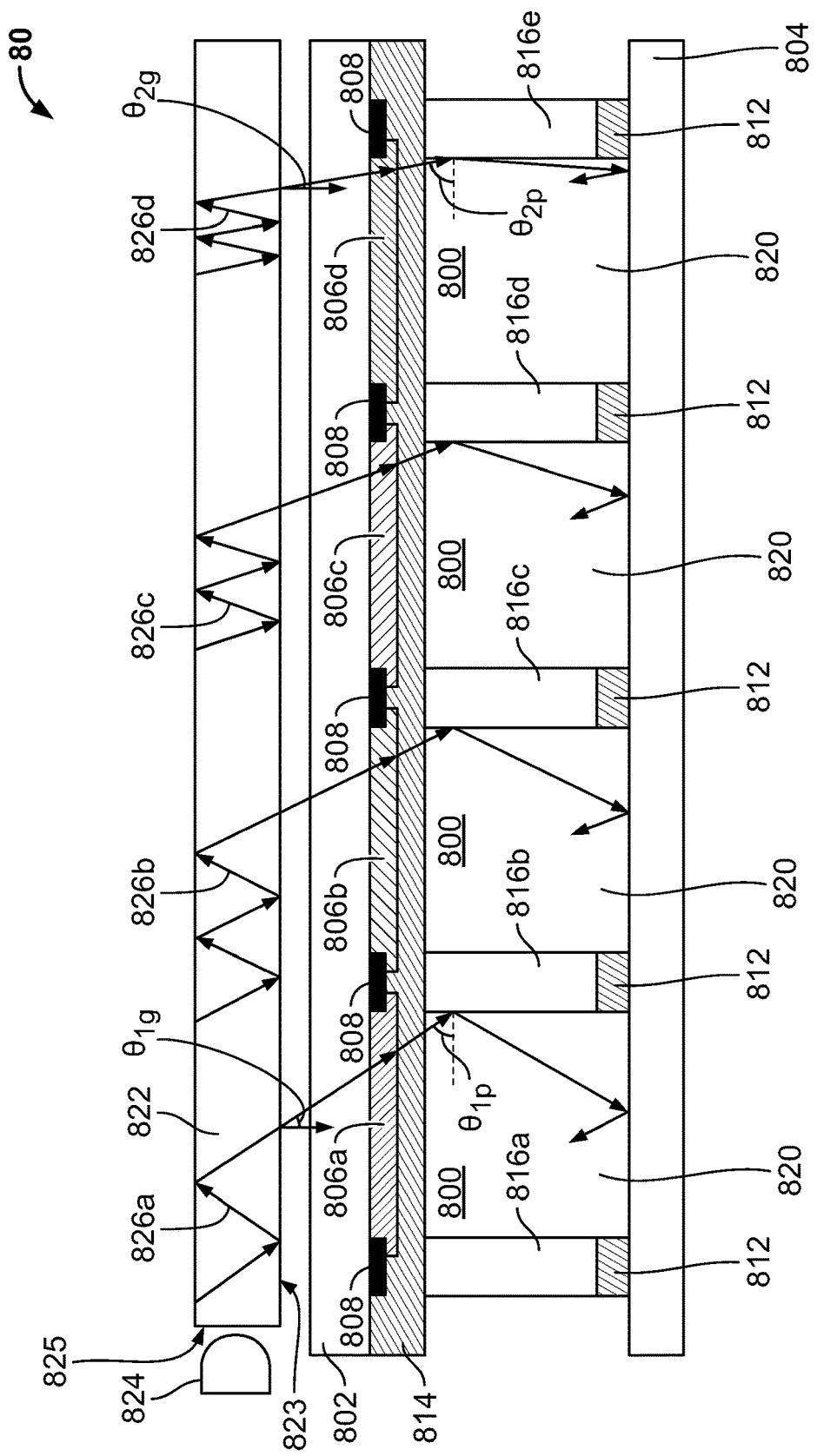
FIG. 8 depicts an electrowetting display device that incorporates a light guide structure and in which the refractive index of the device's pixel spacers has been selected to reduce or mitigate cross-talk between pixels in the device.

To illustrate, FIG. 8 depicts a device 80 that incorporates a light guide structure and in which the refractive index of the device's pixel spacers has been selected to reduce or mitigate cross-talk between pixels in the device.

Device 80 includes a number of pixels 800 between a top support plate 802 and a bottom support plate 804. Pixels 800 are at least partially defined by pixel walls 812 formed over a surface of bottom support plate 804. Fluids, such as an oil and an electrolyte fluid 820, may be at least partially located within the volume defined by pixel walls 812.

Top support plate 802 and bottom support plate 804 may include a number of electrical structures (not shown) including electrodes and switches arranged to apply a desired driving voltage to pixels 800. Top support plate 802 also includes a number of color filters 806a-806d. Black matrix members 808 are positioned over pixel walls 812. An organic layer 814 is formed over black matrix members 808 and color filters 806a-806d.

Pixel spacers 816a-816e are positioned between and may be in contact with the top surfaces of pixel walls 812 and top support plate 802 (specifically, organic layer 814 of top support plate 802). In FIG. 8, each depicted pixel spacer 816a-816e may be a separate structure disposed between top support plate 802 and bottom support plate 804. In that case, pixel spacers 816a-816e may have a similar shape as pixel spacers 118 of FIG. 2A. In another embodiment, however, the pixel spacers 816a-816e depicted in FIG. 8 in cross-section may each be part of a singular pixel spacer structure having a configuration similar to that of pixel spacer 118a depicted in FIG. 2B. References to pixel spacers 816a-816e may refer to individual pixel spacers 816a-816e structures, or pixel spacers 816a-816e that are part of a single pixel spacer grid or structure.

Pixel spacers 816a-816e may be formed of a photoresist material. In device 80, pixel spacers 816a-816e are formed of a material having a refractive index that is less than the refractive index of electrolyte fluid 820. In an embodiment, for example, the refractive index of electrolyte fluid 820 may be approximately 1.5 and the refractive indices of the pixel spacers 816a-816e may be less than 1.5.

Device 80 includes light guide 822 coupled to top support plate 802 of device 80. Light guide 822 may be, for example, a planar light guide that includes a light-transmissive material that facilitates propagation of light in any direction through the body of light guide 822. In some embodiments, outer surfaces of light guide 822 may include patterns, structures, etchings, coatings, adhesives, or other components that reflect light.

A light source 824, such as an LED front light, is coupled to or otherwise emits light into light guide 822. Light source 824 may include lenses and/or other structures or components that control the emission of light from light source 824.

Light guide 822 includes internal structures (not shown) configured to cause the deflection of portions of the light propagating along light guide 822 towards pixels 800 of device 80. Light is therefore emitted out of light guide 822 towards pixels 800 through color filters 806a-806d. That light is ultimately reflected out of pixels 800 towards a viewer of device 80. Light guide 822 is therefore configured to redirect (via mechanisms such as collimating light, distribution of light, etc.) light from light source 824 to provide front lighting for display device 80.

FIG. 8 depicts a number of light rays 826a-826d that have been emitted from light source 824 and are passing through light guide 822. As depicted, lights rays 826a-826d each travel a different distance along light guide 822 before being emitted by light guide 822 towards pixels 800 of device 80. Light guide 822 is generally configured through the incorporation of internal structures (not shown in FIG. 8) so that light rays passing through light guide 822 are emitted at a random point along the length of light guide 822. As such, a volume of light emissions (e.g., brightness) from light guide 822 are consistent along the length of light guide 822.

Different light guides may emit light at different angles along the length of the light guide structure. As depicted in the example of FIG. 8, as light rays get further away from the edge 825 of light guide 822 to which light source 824 is coupled, the angle at which the light rays are emitted from light guide 822 gets closer to being orthogonal to the surface of light guide 822 from which the light rays are emitted. This is illustrated, for example, by comparing light rays 826a and 826d in FIG. 8. Light ray 826a is emitted from a region of light guide 822 that is closer to light source 824 than light ray 826d. Light ray 826a exits surface 823 of light guide at an angle $\Theta_{1g}$ that is greater than the angle $\Theta_{2g}$ at which light ray 826d exits surface 823. It should be noted that different light guide structures may exhibit different behavior in which the angle of light rays emitted by the light guide varies in a different manner along the length of the light guide structure. In some other cases, all light rays emitted by a light guide may be parallel to one another.

Because light rays 826a-826d each exit light guide 822 at different angles, light rays 826a-826d also tend to strike respective pixel spacers 816 at different angles. As a result, each of pixel spacers 816a-816e may be configured to reflect lights rays striking pixel spacers 816a-816e at particular angles. Specifically, each pixel spacer 816a-816e may be fabricated using materials have particular indices of refraction selected so that the critical angle of the interface between each pixel spacer 816a-816e and the surrounding electrolyte fluid 820 will cause the lights rays striking pixel spacers 816a-816e to be reflected.

For example, with reference to FIG. 8, pixel spacer 816b may have an index of refraction so that the interface between pixel spacer 816b and electrolyte 820 reflects light rays (e.g., light ray 826a) striking the interface at an angle $\Theta_{1p}$. In other words, pixel spacer 816b may have an index of refraction selected to that light rays exiting light guide 822 that may strike pixel spacer 816b will be reflected.

Similarly, pixel spacer 816e may have an index of refraction so that the interface between pixel spacer 816e and electrolyte 820 reflects light rays (e.g., light ray 826d) striking the interface at an angle $\Theta_{2p}$. In other words, pixel spacer 816e may have an index of refraction selected to that light rays exiting light guide 822 that may strike pixel spacer 816e will be reflected.

In this configuration, each pixel spacer 816a-816e may have a different index of refraction, depending upon the pixel spacer's location underneath light guide 822. Generally, pixel spacers 816 closer to light source 824 will be struck with light rays at a smaller angle than pixel spacers further from light source 824. As such, pixel spacers 816 closer to light source 824 will generally have a lower refractive index than pixel spacers further from light source 824. This will, in turn, reduce the critical angle of the interface between those pixel spacers 816 and the surrounding electrolyte fluid 820 causing light rays striking that interface to be reflected. For example, in this configuration, pixel spacer 816*b* will generally have a lower refractive index than pixel spacer 816*e*.

In general, in device 80 configuration including light guide 822, pixel spacers 816 that are closer to light source 824 of light guide will have a lower refractive index that pixel spacers that are further from light source 824. In general, each pixel spacers 816 of device 80 may have a refractive index that is selected so that the pixel spacers 816 tend to be reflective to the light ray striking them. The refractive index for a particular pixel spacer 816, therefore, may be selected based upon the attributes of the light guide over that pixel spacer 816.

Accordingly, in other embodiments, light guide 822 may exhibit a different behavior in which light rays emitted nearer the light source may be more normal to a surface of device 80 than light rays emitted further from the light (e.g., the opposite behavior of light guide 822 depicted in FIG. 8). In that case, pixel spacers 816 that are closer to light source 824 of light guide 822 may have a higher refractive index that pixel spacers that are further from light source 824. In other cases, a light rays emitted by light guide 822 may be parallel to one another. In that case, all pixel spacers 816 may have the same (or substantially similar) refractive index.

In embodiments of device 80 in which pixel spacers 816*a*-816*e* are formed as part of a singular pixel spacer structure (e.g., pixel spacer 118*a* of FIG. 2B), the pixel spacer structure may be fabricated so that different regions of the pixel spacer structure exhibit different refractive indices. In some cases, the pixel spacer structure may be manufactured by first fabricating a portion of the pixel spacer structure as a block of spacers having a particular refractive index. This first portion may be fabricated by conventional lithographic processes. Then, another portion of the pixel spacer structure may be formed as a second block of spacers having another refractive index. Those two portions can then be stitched together using convention fabrication techniques. In this manner, a single pixel spacer structure can be fabricated with a number of different regions that have different refractive indices.

Figure 9:
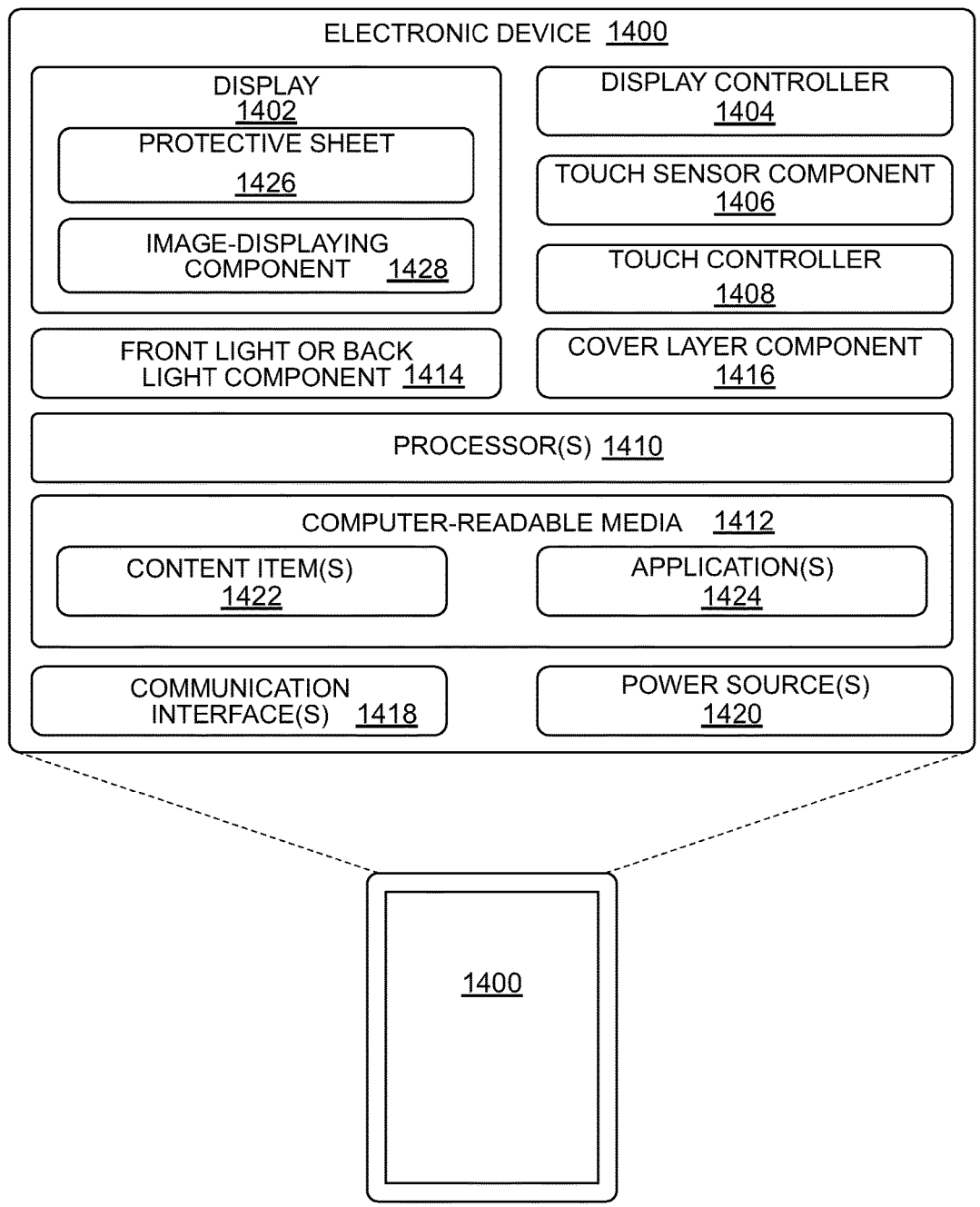
FIG. 9 illustrates an example electronic device that may incorporate a display device, according to various embodiments.

FIG. 9 illustrates an example electronic device 1400 that may incorporate any of the display devices discussed above. Electronic device 1400 may comprise any type of electronic device having a display. For instance, electronic device 1400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400 may be a non-mobile electronic device (e.g., a computer display or a television). In addition, while FIG. 9 illustrates several example components of electronic device 1400, it is to be appreciated that electronic device 1400 may also include other conventional components, such as an operating system, system busses, input/output components, and the like. Further, in other embodiments, such as in the case of a television or computer monitor, electronic device 1400 may only include a subset of the components illustrated.

Regardless of the specific implementation of electronic device 1400, electronic device 1400 includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include an array of pixels as described herein, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 9 illustrates that some examples of electronic device 1400 may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 9 further illustrates that electronic device 1400 may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400 may also store one or more content presentation applications to render content items on electronic device 1400. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400 may couple to a cover (not illustrated in FIG. 9) to protect the display 1402 (and other components in the display stack or display assembly) of electronic device 1400. In one example, the cover may include a back flap that covers a back portion of electronic device 1400 and a front flap that covers display 1402 and the other components in the stack. Electronic device 1400 and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400 includes an ambient light sensor (not illustrated in FIG. 9) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400 may implement a larger default font or a greater contrast when the light is off compared to when the light is on. In some embodiments, electronic device 1400 maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a light guide sheet and a light source (not illustrated in FIG. 9). The light guide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a $3h$ pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the light guide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 9 illustrates a few example components, electronic device 1400 may have additional features or functionality. For example, electronic device 1400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400 may reside remotely from electronic device 1400 in some implementations. In these implementations, electronic device 1400 may utilize communication interfaces 1418 to communicate with and utilize this functionality.

In an embodiment, an electrowetting display device includes a first support plate and a second support plate opposite the first support plate, and a plurality of pixel walls over the first support plate. The plurality of pixel walls are associated with an electrowetting pixel and define a volume containing at least a portion of an oil and an electrolyte fluid. The electrolyte fluid has a first refractive index. The electrowetting display device includes a pixel spacer between a first pixel wall in the plurality of pixel walls and the second support plate. A second refractive index of the pixel spacer is less than the first refractive index. The electrowetting display device includes a pixel electrode over the first support plate for applying a voltage within the electrowetting pixel to cause relative displacement of the oil and the electrolyte fluid.

In another embodiment, a device includes a support plate and a plurality of pixel walls over the support plate. The plurality of pixel walls are associated with a pixel and define a volume containing an electrolyte fluid. The electrolyte fluid has a first refractive index. The device includes a first pixel spacer over a first pixel wall in the plurality of pixel walls. A second refractive index of the first pixel spacer is less than the first refractive index of the electrolyte fluid.

In another embodiment, a device includes a support plate and a plurality of pixel walls over the support plate. The plurality of pixel walls are associated with a pixel and define a volume containing an electrolyte fluid. The device includes a first pixel spacer over a first pixel wall in the plurality of pixel walls. A critical angle of an interface between the electrolyte fluid and the first pixel spacer is less than 90 degrees.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
   a first support plate and a second support plate opposite the first support plate;
   a plurality of pixel walls over the first support plate, the plurality of pixel walls being associated with an electrowetting pixel and defining a volume containing at least a portion of an oil and an electrolyte fluid, wherein the electrolyte fluid has a first refractive index;
a pixel spacer between a first pixel wall in the plurality of pixel walls and the second support plate, wherein a second refractive index of the pixel spacer is less than the first refractive index; and
a pixel electrode over the first support plate for applying a voltage within the electrowetting pixel to cause relative displacement of the oil and the electrolyte fluid.

2. The electrowetting display device of claim 1, further comprising:
a light guide coupled to the second support plate;
a light source optically coupled to a first edge of the light guide; and
a second pixel spacer between a second pixel wall in the plurality of pixel walls and the second support plate, wherein a first distance between the second pixel spacer and the first edge of the light guide is less than a second distance between the pixel spacer and the first edge of the light guide and a third refractive index of the second pixel spacer is less than the second refractive index.

3. The electrowetting display device of claim 1, further comprising:
a light guide coupled to the second support plate; and
a light source optically coupled to a first edge of the light guide, wherein the light guide is configured to emit light rays into the electrowetting pixel at a first angle with respect to a line orthogonal to a sidewall surface of the pixel spacer and wherein a critical angle of an interface between the electrolyte fluid and the pixel spacer is less than the first angle.

4. The electrowetting display device of claim 1, wherein a critical angle of an interface between the electrolyte fluid and the pixel spacer is equal to or less than 60 degrees.

5. A device, comprising:
a support plate;
a plurality of pixel walls over the support plate, the plurality of pixel walls being associated with a pixel and defining a volume containing an electrolyte fluid, the electrolyte fluid having a first refractive index; and
a first pixel spacer over a first pixel wall in the plurality of pixel walls, wherein a second refractive index of the first pixel spacer is less than the first refractive index of the electrolyte fluid.

6. The device of claim 5, further comprising:
a second support plate opposite the support plate;
a light guide coupled to the second support plate; and
a light source optically coupled to a first edge of the light guide.

7. The device of claim 6, further comprising a second pixel spacer over a second pixel wall in the plurality of pixel walls, wherein a first distance between the first pixel spacer and the first edge of the light guide is greater than a second distance between the second pixel spacer and the first edge of the light guide and a third refractive index of the second pixel spacer is less than the second refractive index.

8. The device of claim 5, further comprising a second pixel spacer over a second pixel wall in the plurality of pixel walls, a second refractive index of the second pixel spacer being different from the first refractive index of the first pixel spacer.

9. The device of claim 5, further comprising:
a second support plate opposite the support plate;
a light guide coupled to the second support plate; and
a light source optically coupled to a first edge of the light guide, wherein the light guide is configured to emit light rays into the pixel at a first angle with respect to a line orthogonal to a surface of a sidewall of the first pixel spacer and wherein a critical angle of an interface between the electrolyte fluid and the first pixel spacer is less than the first angle.

10. The device of claim 5, wherein a critical angle of an interface between the electrolyte fluid and the first pixel spacer is equal to or less than 60 degrees.

11. The device of claim 5, wherein the first pixel spacer includes at least one of silicon dioxide, magnesium fluoride, calcium fluoride, and fluoroacrylate polymer.

12. The device of claim 5, wherein the first pixel spacer includes a grid structure, wherein a portion of the grid structure is in contact with a portion of each pixel wall in the plurality of pixel walls.

13. A device, comprising:
a support plate;
a plurality of pixel walls over the support plate, the plurality of pixel walls being associated with a pixel and defining a volume containing an electrolyte fluid; and
a first pixel spacer over a first pixel wall in the plurality of pixel walls, wherein a critical angle of an interface between the electrolyte fluid and the first pixel spacer is less than 90 degrees.

14. The device of claim 13, wherein the interface between the electrolyte fluid and the first pixel spacer includes a surface of a sidewall of the first pixel spacer.

15. The device of claim 13, further comprising:
a second support plate opposite the support plate;
a light guide coupled to the second support plate; and
a light source optically coupled to a first edge of the light guide.

16. The device of claim 15, wherein a first portion of the first pixel spacer has a first refractive index and a second portion of the first pixel spacer has a second refractive index, the second refractive index is greater than the first refractive index, and the first portion of the first pixel spacer is closer to the first edge of the light guide than the second portion of the first pixel spacer.

17. The device of claim 13, further comprising a second pixel spacer over a second pixel wall in the plurality of pixel walls, a second refractive index of the second pixel spacer being different from a first refractive index of the first pixel spacer.

18. The device of claim 13, further comprising:
a second support plate opposite the support plate;
a light guide coupled to the second support plate; and
a light source optically coupled to a first edge of the light guide, wherein the light guide is configured to emit light rays into the pixel at a first angle with respect to a line orthogonal to a surface of the first pixel spacer and wherein the critical angle is less than the first angle.

19. The device of claim 13, wherein the first pixel spacer includes a grid structure, wherein a portion of the grid structure is in contact with a portion of each pixel wall in the plurality of pixel walls.

20. The device of claim 13, wherein the critical angle of an interface between the electrolyte fluid and the first pixel spacer is equal to or less than 60 degrees.

* * * * *